United States Patent
Kang et al.

(10) Patent No.: US 8,988,778 B2
(45) Date of Patent: Mar. 24, 2015

(54) COLOR FILTER ARRAY USING DICHROIC FILTER

(75) Inventors: Joo-Young Kang, Yongin-si (KR); Sang-Wook Han, Seoul (KR); Won-Hee Choe, Suwon-si (KR); Seong-Deok Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 416 days.

(21) Appl. No.: 12/964,914

(22) Filed: Dec. 10, 2010

(65) Prior Publication Data

US 2011/0141561 A1 Jun. 16, 2011

(30) Foreign Application Priority Data

Dec. 11, 2009 (KR) .................. 10-2009-0123327

(51) Int. Cl.
| | |
|---|---|
| *G02B 5/30* | (2006.01) |
| *G02B 27/28* | (2006.01) |
| *G02B 5/20* | (2006.01) |
| *G02B 5/28* | (2006.01) |
| *H01L 27/146* | (2006.01) |
| *H01L 31/0216* | (2014.01) |

(52) U.S. Cl.
CPC ............ *G02B 5/201* (2013.01); *G02B 5/286* (2013.01); *H01L 27/14621* (2013.01); *H01L 31/02165* (2013.01)
USPC .............................. 359/491.01; 359/483.01

(58) Field of Classification Search
CPC ....... H01L 33/58; H01L 27/156; H01L 33/50; H01L 33/504; H01L 33/08; G02B 13/0085; G02B 3/0037; G02B 3/0062; G02B 6/4295
USPC .............. 359/491.01, 619, 891, 275, 887; 348/342; 257/79, 80–98
See application file for complete search history.

(56) References Cited

U.S. PATENT DOCUMENTS

| 7,880,785 B2* | 2/2011 | Gallagher .................. 348/276 |
| 2006/0017829 A1* | 1/2006 | Gallagher .................. 348/276 |

(Continued)

FOREIGN PATENT DOCUMENTS

| JP | 2003-110801 | 4/2003 |
| JP | 2005-6066 | 1/2005 |

(Continued)

OTHER PUBLICATIONS

Stapels, Christopher J., Lawrence, William G., Augustine, Frank L., Christian, James F., Characterization of a CMOS Geiger Photodiode Pixel, Apr. 2006, IEEE Transactions of Electron Devices, vol. 53, No. 4, pp. 631-635.*

(Continued)

*Primary Examiner* — William Choi
*Assistant Examiner* — Sharrief Broome
(74) *Attorney, Agent, or Firm* — NSIP Law (57) ABSTRACT

A color filter array may include a plurality of pixels and control a pass wavelength band of the plurality of pixels using a dichroic filter that passes light of a specific wavelength range and blocks the rest of wavelengths. The pass wavelength band of the plurality of pixels may be adjusted according to a plurality of thicknesses of the dichroic filter. The dichroic filter may be formed by repeatedly forming a layer of titanium dioxide ($TiO_2$) and a layer of silicon dioxide ($SiO_2$).

16 Claims, 10 Drawing Sheets

(56) References Cited

U.S. PATENT DOCUMENTS

| | | |
|---|---|---|
| 2006/0087612 A1* | 4/2006 | Kuan et al. .................... 349/165 |
| 2006/0186322 A1 | 8/2006 | Matsuyama |
| 2006/0289958 A1* | 12/2006 | Sasaki ........................... 257/440 |
| 2007/0014019 A1* | 1/2007 | Mouli ............................ 359/619 |
| 2007/0024931 A1* | 2/2007 | Compton et al. ............. 358/512 |
| 2007/0145273 A1* | 6/2007 | Chang ........................ 250/338.1 |
| 2007/0235756 A1* | 10/2007 | Kato ............................. 257/184 |
| 2007/0273781 A1* | 11/2007 | Choe et al. .................... 348/311 |
| 2010/0085433 A1 | 4/2010 | Choe et al. |
| 2010/0097495 A1 | 4/2010 | Choe et al. |
| 2010/0124373 A1 | 5/2010 | Yoo et al. |
| 2013/0063817 A1* | 3/2013 | Santori et al. ................ 359/471 |

FOREIGN PATENT DOCUMENTS

| | | |
|---|---|---|
| KR | 10-2006-0093651 | 8/2006 |
| KR | 10-0870352 | 11/2008 |
| KR | 10-2010-0039120 | 4/2010 |
| KR | 10-2010-0042957 | 4/2010 |
| KR | 10-2010-0055067 | 5/2010 |

OTHER PUBLICATIONS

Stapels, Christopher J., Lawrence, William G., Augustine, Frank L., Christian, James F., Characterization of a CMOS Geiger Photodiode Pixel, Apr. 2006, IEEE Transactions of Electron Devices, Vol53, No. 4, pp. 631-635.*

* cited by examiner

COLOR FILTER ARRAY USING DICHROIC FILTER

CROSS-REFERENCE TO RELATED APPLICATION(S)

This application claims the benefit under 35 U.S.C. §119 (a) of Korean Patent Application No. 10-2009-0123327, filed on Dec. 11, 2009, the entire disclosure of which is incorporated herein by reference for all purposes.

BACKGROUND

1. Field

The following description relates to a color filter array formed on an image sensor.

2. Description of the Related Art

Generally, a color filter array refers to a mosaic of color filters which are placed on an image sensor and filter light by wavelength range to capture color information.

A typical example of a color filter array is a Bayer pattern which is formed by repeatedly arranging a 2×2 array of pixels including a red pixel and a green pixel (RG) and a green pixel and a blue pixel (GB). The color filter array with the Bayer pattern can represent primary colors without any processing since it has red, green and blue pixels to obtain the primary colors of light. However, there is a loss of sensitivity in the image obtained by the color filter array using the Bayer pattern.

Recently, to overcome such drawbacks of the Bayer pattern color filter array, a color filter array having a transparent pixel substituted for one of RGB pixels has been introduced. The substituted transparent pixel passes light and infrared light. The white light and the infrared light that have passed through the transparent pixel are detected by an image sensor. A white light signal and an infrared light signal have wider wavelength ranges than individual RGB signals, and thus an image with improved sensitivity can be obtained using the combination of the white light signal and the infrared light signal. However, the use of infrared light to increase the sensitivity of an image may cause noise in the image due to infrared light components incident on color pixels.

SUMMARY

In one general aspect, there is provided a color filter array, comprising: a pixel layer comprising a plurality of pixels; and a dichroic filter corresponding to the plurality of pixels, the dichroic filter being formed either above or below the pixel layer.

The color filter array may further include that: the dichroic filter comprises a plurality of regions comprising a plurality of thicknesses that correspond to the plurality of pixels; and the dichroic filter is configured to filter a specific wavelength range of light that is to be incident to the plurality of pixels or that has passed through the plurality of pixels, according to the plurality of thicknesses of the plurality of regions corresponding to the plurality of pixels.

The color filter array may further include that the plurality of pixels comprises: color pixels configured to allow visible light corresponding to a specific color and infrared to pass therethrough; and transparent pixels configured to allow white light and infrared light to pass therethrough.

The color filter array may further include that each of the color pixels comprises: one of: a red pixel, a green pixel and a blue pixel; or one of: a cyan pixel, a magenta pixel and a yellow pixel.

The color filter array may further include that the dichroic filter is further configured to block one of: infrared light incident to the color pixels and infrared light that has passed through the color pixels.

The color filter array may further include that the dichroic filter is further configured to block one of: visible light incident to the transparent pixels and visible light that has passed through the transparent pixels.

The color filter array may further include that the dichroic filter comprises a layered structure in which a layer of titanium dioxide ($TiO_2$) and a layer of silicon dioxide ($SiO_2$) are repeatedly formed.

In another general aspect, there is provided a color filter array, comprising: a dichroic filter comprising a plurality of pixels, the plurality of pixels being configured to: allow light of a specific wavelength range to pass therethrough, and reflect all other wavelengths.

The color filter array may further include that the specific wavelength range of the light to be passed through the plurality of pixels is determined according to a plurality of thicknesses of the plurality of pixels.

The color filter array may further include that the dichroic filter comprises a layered structure in which a layer of titanium dioxide ($TiO_2$) and a layer of silicon dioxide ($SiO_2$) are repeatedly formed.

The color filter array may further include that: the dichroic filter comprises a plurality of regions comprising a plurality of thicknesses; and a filtering of a specific wavelength range of light by the dichroic filter is dependent upon the plurality of thicknesses of the plurality of regions.

The color filter array may further include that: the dichroic filter comprises a plurality of regions comprising a plurality of thicknesses; and the plurality of thicknesses are configured to determine a specific wavelength range of light that will pass through the dichroic filter and other wavelengths that will be reflected by the dichroic filter.

The color filter array may further include that: the dichroic filter comprises a plurality of regions comprising a plurality of thicknesses; and wavelength ranges of light to be passed through the dichroic filter are determined by adjusting the plurality of thicknesses.

Other features and aspects may be apparent from the following detailed description, the drawings, and the claims.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art. The progression of processing steps and/or operations described is an example; however, the sequence of steps and/or operations is not limited to that set forth herein and may be changed as is known in the art, with the exception of steps and/or operations necessarily occurring in a certain order. Also, descriptions of well-known functions and constructions may be omitted for increased clarity and conciseness.

Figure 1:
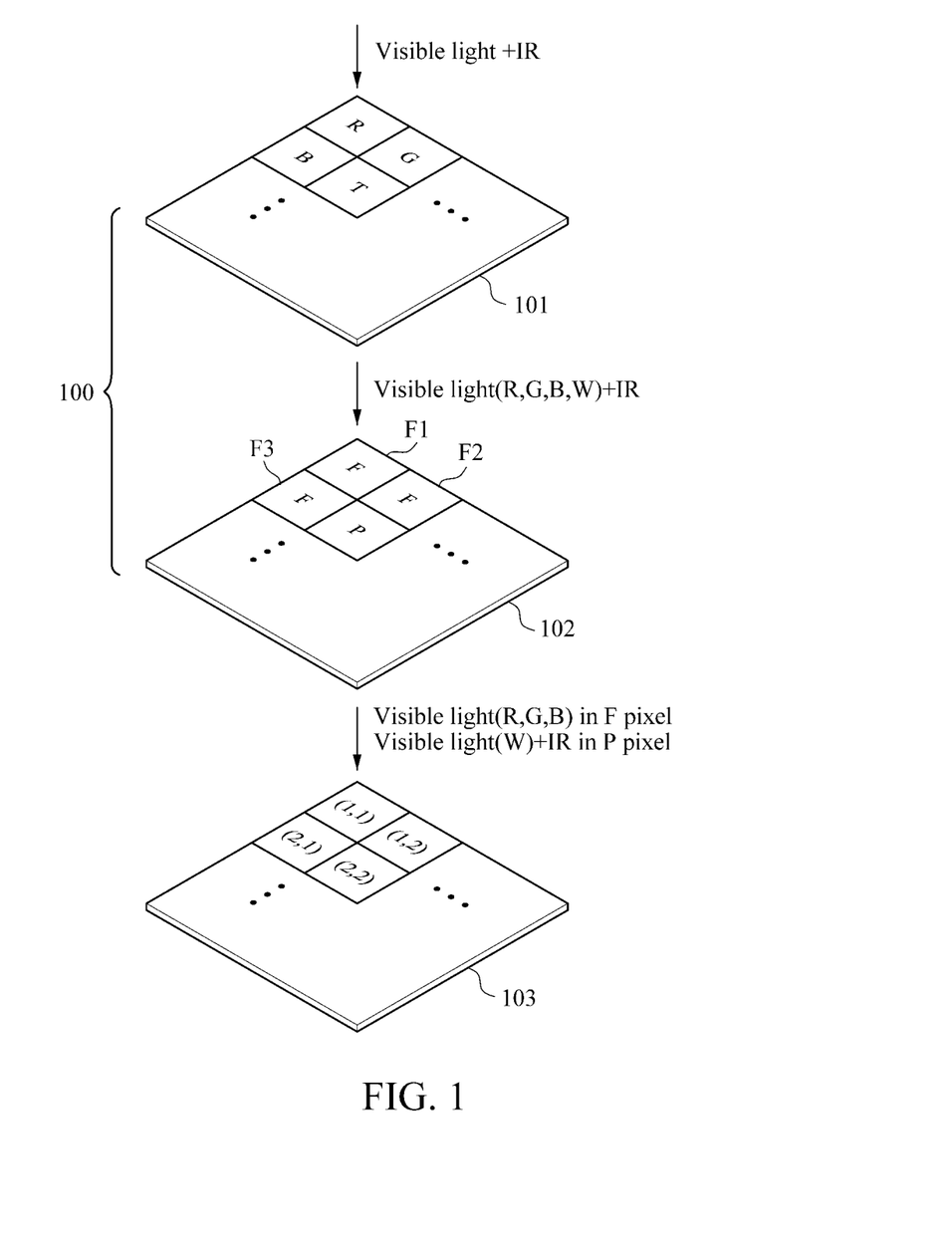
FIG. 1 is a diagram illustrating an example of a color filter array.

FIG. 1 illustrates an example of a color filter array. Referring to FIG. 1, the color filter array 100 includes a pixel layer 101 and a dichroic filter 102.

The pixel layer 101 includes a plurality of pixels. The pixels include color pixels including a red pixel R, a green pixel G, and a blue pixel B and transparent pixels T. Each of the color pixels R, G, and B passes infrared light or visible light corresponding to a specific color. The transparent pixels T pass infrared light and white light (that is, the entire band of wavelengths in the visible light spectrum).

For example, light that has passed through the red pixel R of the pixel layer 101 may be light of wavelengths ranging from about 680 nm to 780 nm, which corresponds to red light, or light of wavelengths greater than 780 nm, which corresponds to infrared light. Light that has passed the green pixel G may be light of wavelengths ranging from about 540 nm to 580 nm, which corresponds to green light, or light of wavelengths greater than 780 nm, which corresponds to infrared light. Light that has passed through the blue pixel B may be light of wavelengths ranging from about 460 nm to 500 nm, which corresponds to blue light, or light of wavelengths greater than 780 nm, which corresponds to infrared light. Thus, the red, green, and blue pixels R, G, and B of the pixel layer 101 pass light of wavelengths within predetermined ranges and infrared light.

Light that has passed through the transparent pixel T may be light of wavelengths ranging from about 400 nm to 780 nm, which corresponds to white light, or light of wavelengths greater than 780 nm, which corresponds to infrared light. That is, the transparent pixels T of the pixel layer 101 pass light of the entire visible wavelengths and infrared light.

The pixel layer 101 may be formed based on a Bayer filter array in which at least one of color pixels is substituted by a transparent pixel. Furthermore, the color pixels of the pixel layer 101 may be configured to include a cyan pixel C, a magenta pixel M, and a yellow pixel Y.

The dichroic filter 102 may be disposed on the bottom of the pixel layer 101 or on the rear of the pixel layer 101. These dispositions of the dichroic filter 102 enable light to pass through the pixel layer 101 and to be inputted to the dichroic filter 102 before the light is inputted to an image sensor 103.

The dichroic filter 102 is an optical device that passes light of specific wavelengths and reflects the rest of the wavelengths according to its thickness.

The dichroic filter 102 includes F pixels to be disposed below the color pixels R, G, and B, and P pixels to be disposed below the transparent pixels T. The F pixels and the P pixels may have different thicknesses from each other. For example, according to the thickness of a region of the dichroic filter 102, the F pixels may block infrared light among light that has passed through the color pixels R, G, and B, and the P pixels may block visible light among light that has passed through the transparent pixel T. However, the light wavelengths to be passed or blocked by the F pixels and the P pixels may be determined according to the thicknesses of each F pixel and each P pixel for the purpose of the application of the color filter array 100.

The dichroic filter 102 may be made by repeatedly laminating a layer of titanium dioxide ($TiO_2$) and a layer of silicon dioxide ($SiO_2$).

The light that has passed through the dichroic filter 102 is inputted to the image sensor 103. The image sensor 103 senses the light and creates an electrical signal corresponding to the sensed light. The image sensor 103 may include a plurality of pixels, and each pixel may sense the light and generate an electrical signal corresponding to the sensed light. For example, in the example illustrated in FIG. 1, a pixel (1, 1) on the image sensor 103 may detect red light from which an infrared component has removed. A pixel (1, 2) may detect green light from which an infrared component has been removed. A pixel (2, 1) may detect blue light from which an infrared component has been removed. A pixel (2, 2) may detect white light and infrared light. However, the light wavelengths to be detected by the pixels of the image sensor 103 may vary with the thicknesses of pixels of the dichroic filter 102, as described above.

In other words, although in the example illustrated in FIG. 1, the F pixels block infrared light and the P pixels block or pass visible light, this is only for convenience of explanation. The light wavelengths to enter each of the pixels on the image sensor 103 may vary by adjusting thicknesses of regions of the dichroic filter 102. For example, each F pixel may pass some light within specific wavelength ranges corresponding to a specific color, or different F pixels including F1, F2, and F3 pixels may be disposed respectively below a red pixel, a green pixel and a blue pixel. Each P pixel may block particular wavelengths of the white light and/or infrared light.

Therefore, the wavelength ranges of light to be input to the image sensor 103 can be determined by the respective pixels by adjusting the thicknesses of regions of the dichroic filter 102.

Figure 2:
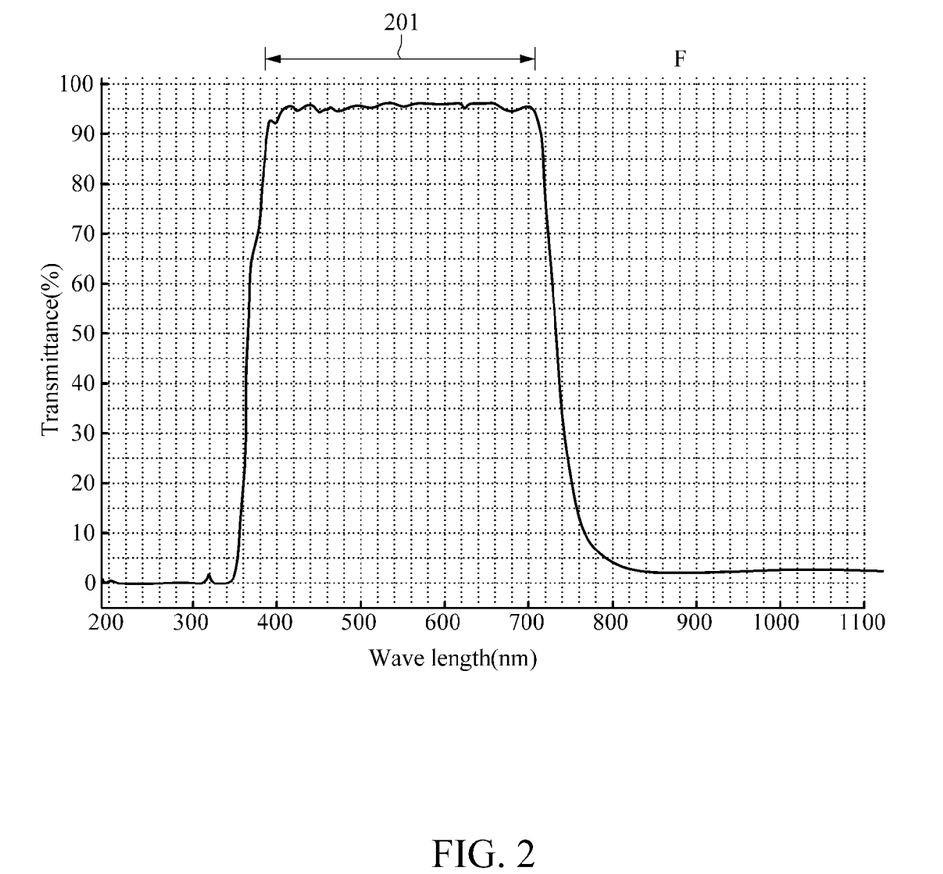
FIG. 2 is a graph showing an example of light filtering characteristics of an F pixel.

FIG. 2 illustrates a graph showing example of light filtering characteristics of an F pixel. Referring to FIG. 2, the F pixel has a filtering function to selectively pass light of wavelengths ranging from about 400 nm to 700 nm. A range 201 of wavelengths to pass through the F pixel may be varied by adjusting the thickness of a region of the dichroic filter 102 corresponding to the F pixel.

Figure 3A:
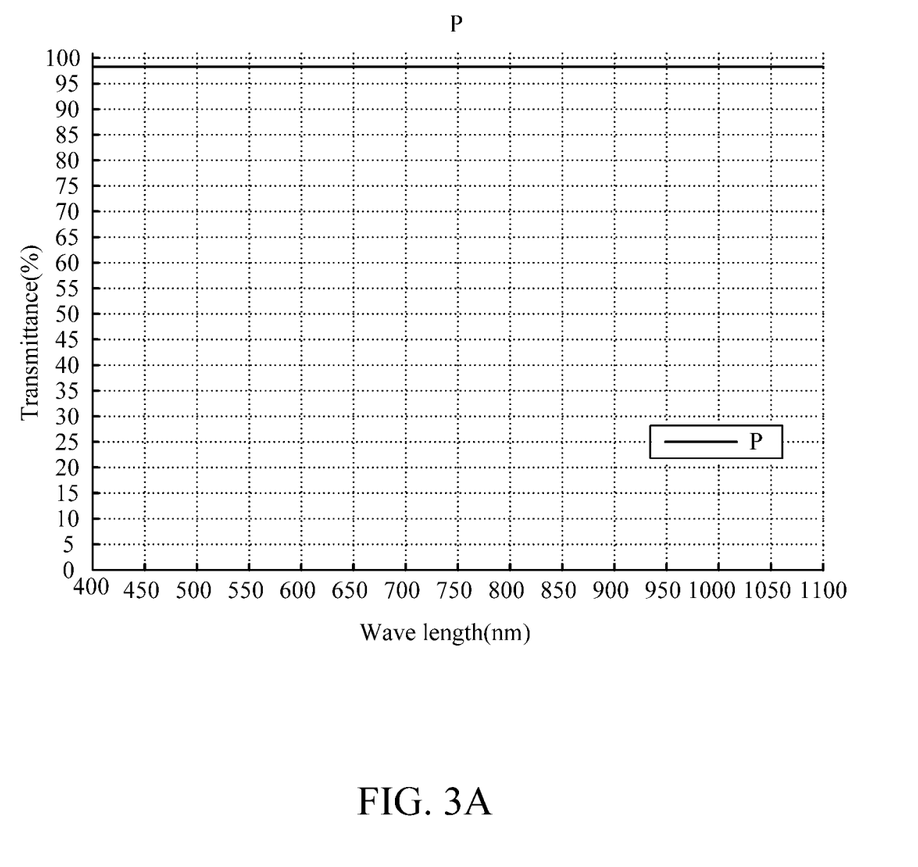
FIGS. 3A to 3D are graphs, each showing examples of filtering characteristics of a P pixel.

FIGS. 3A to 3D illustrate graphs, each showing examples of filtering characteristics of a P pixel. Referring to FIG. 3A, the P pixel passes light of almost all wavelengths. In this case, the P pixel may pass white light and infrared light.

Figure 3B:
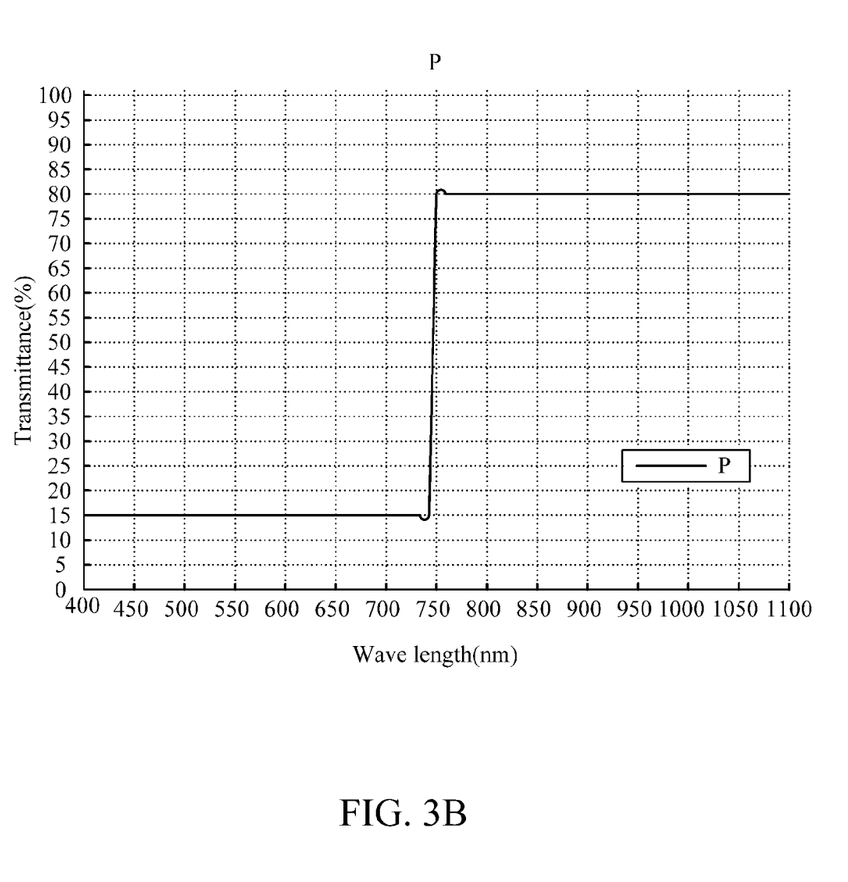

Referring to FIG. 3B, the P pixel blocks light of wavelengths ranging from about 400 nm to 750 nm, and passes light of wavelengths greater than 750 nm. In this case, the P pixel may selectively pass only infrared light from light that has passed through a transparent pixel T.

Figure 3C:
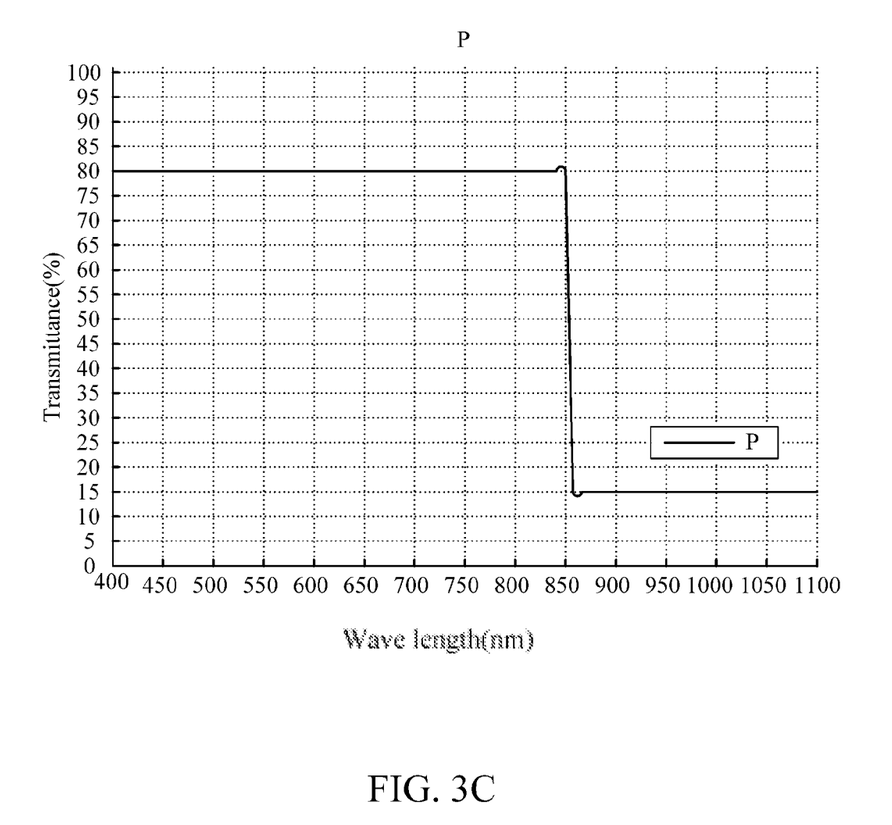

Referring to FIG. 3C, the P pixel passes light of wavelengths ranging from about 400 nm to 850 nm, and blocks light of wavelengths greater than 850 nm. That is, the P pixel may block infrared light and selectively pass visible light from light that has passed through the transparent pixel P.

Figure 3D:
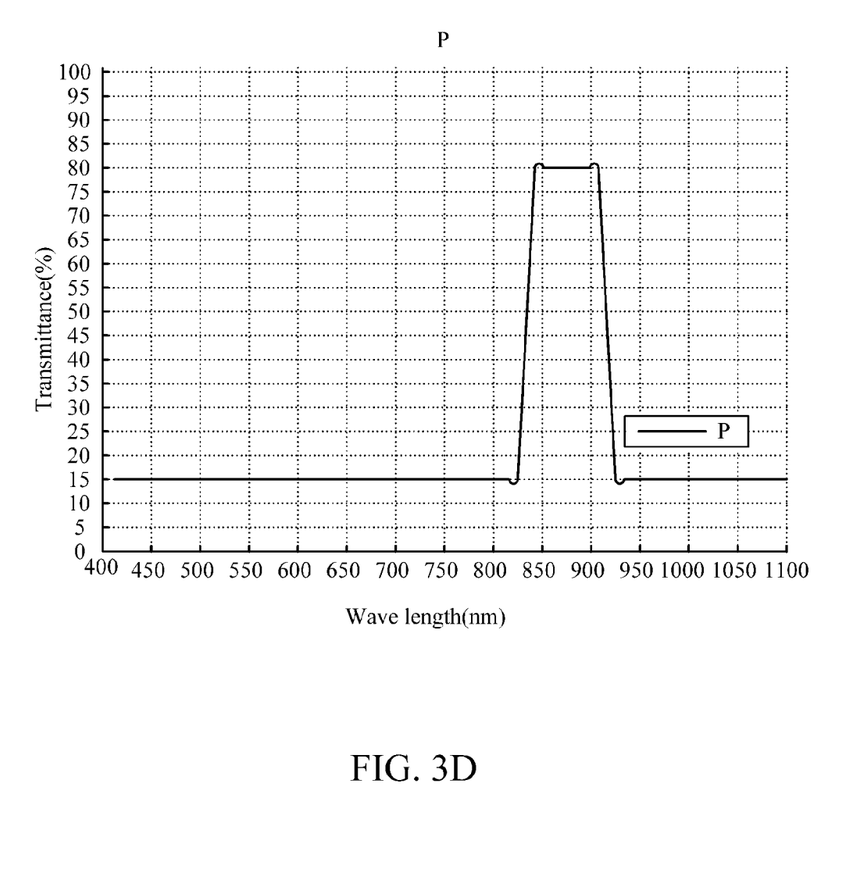

Referring to FIG. 3D, the P pixel selectively passes light of wavelengths ranging from about 850 nm to 920 nm. Thus, the P pixel may selectively pass light of particular infrared wavelengths from light that has passed through the transparent pixel T.

As shown in graphs illustrated in FIGS. 3A to 3D, the filtering characteristics of the P pixel may vary according to the light wavelengths to pass through the P pixel by adjusting the thickness of a region of the dichroic filter 102 corresponding to the P pixel.

Figure 4:
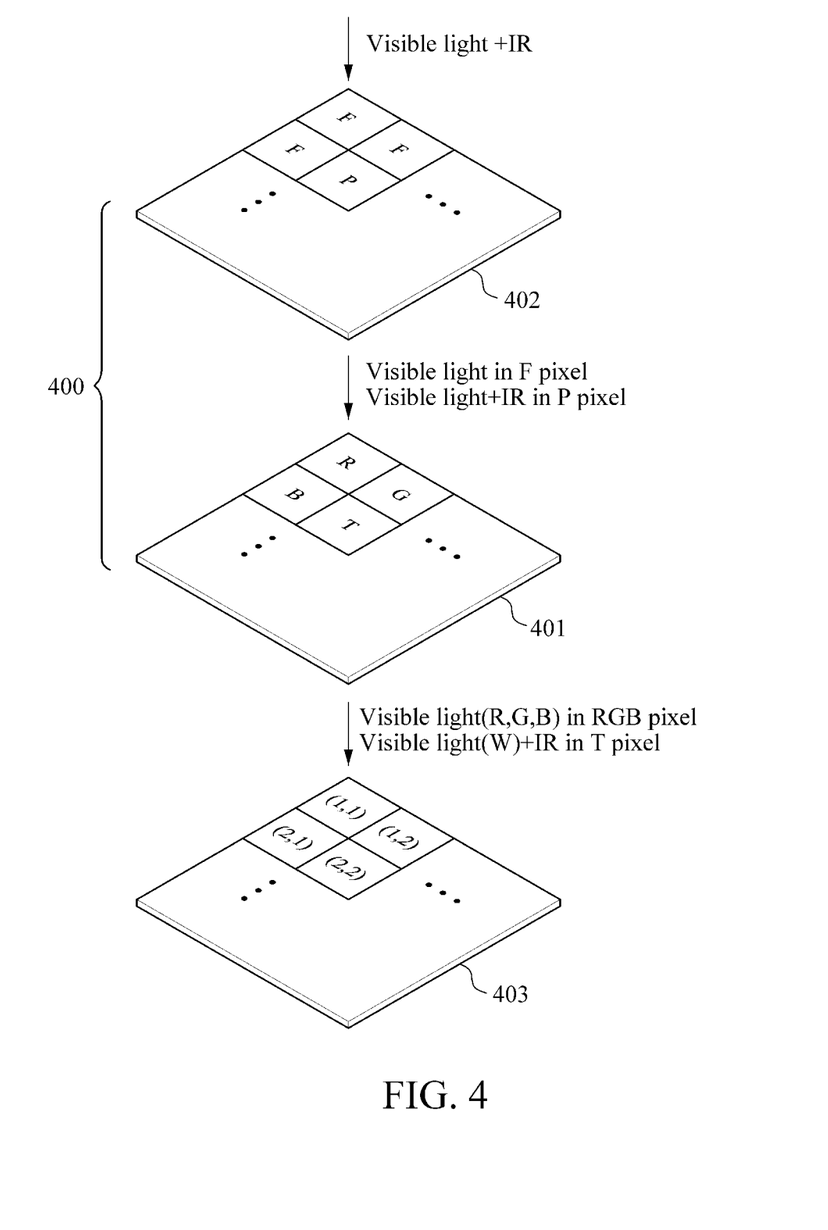
FIG. 4 is a diagram illustrating another example of a color filter array.

FIG. 4 illustrates another example of a color filter array. Referring to FIG. 4, the color filter array 400 includes a pixel layer 401 and a dichroic filter 402.

The pixel layer 401 may be formed based on a Bayer filter array in which at least one color pixel is substituted by a transparent pixel. The detailed description of the pixel array 401 is the same as the description of the pixel layer 101 shown in the example illustrated in FIG. 1.

The dichroic filter 402 is disposed on an upper portion or a front portion of the pixel layer 401. The disposition of the dichroic filter 402 allows light to pass through the dichroic filter 402 first and then to be input to the pixel layer 401 before the light enters an image sensor 403.

The dichroic filter 402 includes F pixels to be disposed on the respective color pixels R, G, and B, and P pixels to be disposed on each of the transparent pixels T. The thicknesses of the F pixels and the P pixels may be different from each other. For example, according to the thicknesses of corresponding regions of the dichroic filter 402, the F pixels may block infrared light among light that is to be incident to the color pixels R, G, and B, and the P pixel may block visible light among light is to be incident to the transparent pixel T. However, the light wavelengths to be passed or blocked by the F pixels and the P pixels may be determined by adjusting the thicknesses of each F pixel and each P pixel of the dichroic filter 402, as described above.

Light that has passed through the dichroic filter 402 is inputted to the image sensor 403 via the pixel layer 402. The light that has passed through a red pixel R on the pixel layer 401 may be light of wavelengths ranging from about 680 nm to 780 nm, corresponding to red light. The light that has passed through a green pixel G on the pixel layer 401 may be light of wavelengths ranging from about 540 nm to 580 nm, corresponding to green light, and the light that has passed through a blue pixel B on the pixel layer 401 may be light of wavelengths ranging from about 460 nm to 500 nm, corresponding to blue light. In addition, the light that has passed through a transparent pixel T on the pixel layer 401 may be light of wavelengths greater than 780 nm, corresponding to infrared light.

Figure 5:
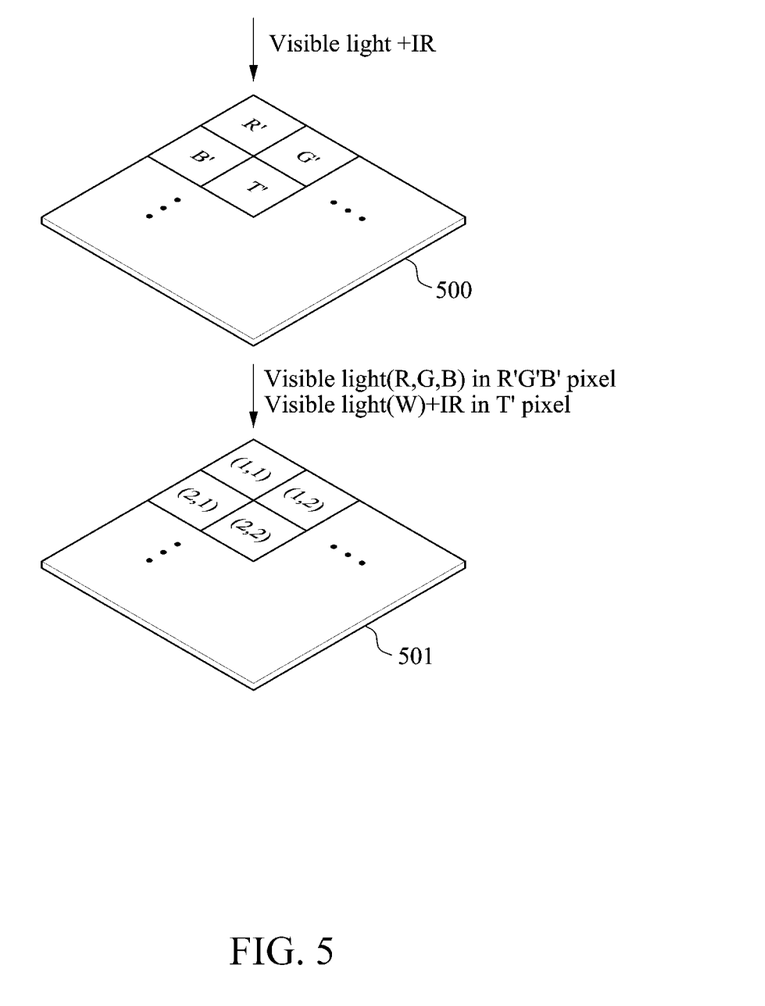
FIG. 5 is a diagram illustrating another example of a color filter array.

FIG. 5 illustrates another example of a color filter array. Referring to FIG. 5, a color filter array 500 is formed on an upper portion or a front portion of an image sensor 501.

The color filter array 500 is formed based on a dichroic filter. The dichroic filter may be an optical device that passes light of a particular wavelength and reflects the rest of the light wavelengths according to its thickness. For example, the color filter array 500 may be formed by repeatedly laminating a layer of titanium dioxide ($TiO_2$) and a layer of silicon dioxide ($SiO_2$) and then etching a lamination structure on the laminated layers such that pixels have different thicknesses.

By adjusting thicknesses of each pixel of the color filter array 500 as described above, a red pixel R' may selectively pass red light, a green pixel G' may selectively pass green light, and a blue pixel B' may selectively pass blue light. In addition, a transparent pixel T' may allow visible light of a specific wavelength range and/or infrared light to pass therethrough.

The light that has passed through the color filter array 500 is incident to an image sensor 501. Pixels of the image sensor 501 individually detect light and generate electrical signals corresponding to the detected light. For example, in an example illustrated in FIG. 5, a pixel (2, 2) may detect infrared light only within particular wavelengths.

Figure 6:
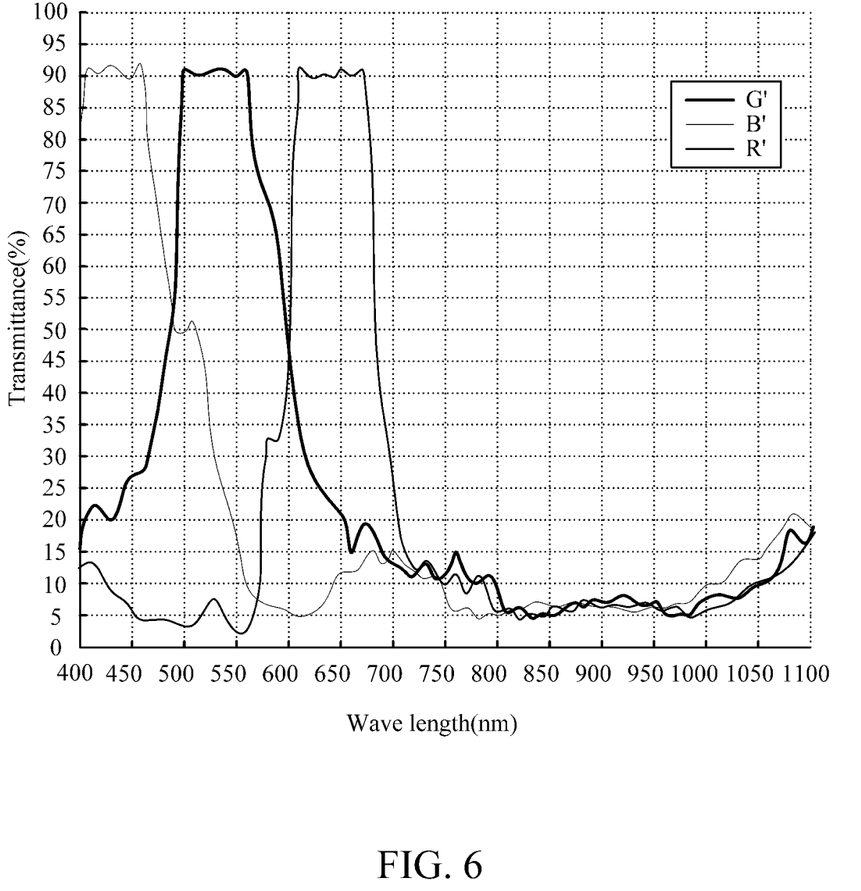
FIG. 6 is a graph showing an example of light filtering characteristics of a color filter array shown in FIG. 5.

FIG. 6 illustrates a graph showing example of light filtering characteristics of a color filter array shown in FIG. 5. The graph illustrated in FIG. 6 shows characteristics of the red pixel R', the green pixel G', and the blue pixel B' which are illustrated in FIG. 5, and the characteristics of these pixels R', G', and B' are not limited thereto.

Referring to FIG. 6, the red pixel R' selectively passes only light of wavelengths ranging from about 600 nm to 670 nm, the green pixel G' selectively passes only light of wavelengths ranging from about 500 nm to 550 nm, and the blue pixel B' selectively passes only light of wavelengths ranging from about 400 nm to 450 nm.

As such, the color filter array 500 may be formed based on a dichroic filter and the light filtering characteristics of each pixel may be determined by adjusting the thickness of the pixel.

Figure 7:
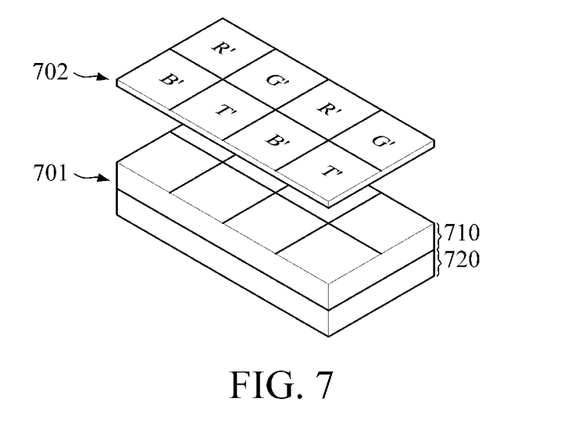
FIGS. 7 and 8 are diagrams illustrating examples of an image sensor.
Figure 8:
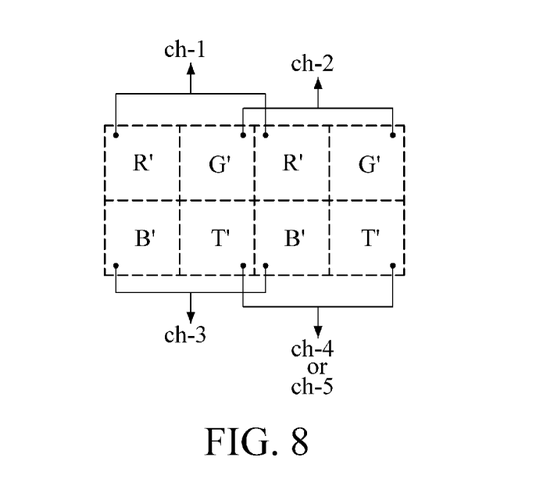

FIGS. 7 and 8 illustrate examples of an image sensor. Referring to FIG. 7, an image sensor 701 senses light that has passed through a color filter array 702, and generates an electrical image signal corresponding to the sensed light. The image sensor 701 may be an image sensor such as a charge-coupled device (CCD) or a complementary metal-oxide semiconductor (CMOS).

The image sensor 701 may include at least two layers. A first layer 710 senses light that has passed through a red pixel R', a green pixel G' and a blue pixel B', and generates color signals corresponding to the sensed light. In addition, the first layer 710 may sense white light from light that has passed through a transparent pixel T', and generate a white light signal corresponding to the white light. A second layer 720 may sense infrared light from light that has passed through the transparent pixel T', and generate an infrared light signal corresponding to the sensed infrared light.

A signal generated by the image sensor 701 may include a plurality of sub-channel signals. For example, as shown in an example illustrated in FIG. 8, the image signal corresponding to the light that has passed through the red pixel R' may be a first sub-channel signal. The image signal corresponding to the light that has passed through the green pixel G' may be a second sub-channel signal. The image signal corresponding to the light that has passed through the blue pixel B' may be a third sub-channel signal. The white light signal corresponding to the white light that has passed through the transparent pixel T' and has been sensed by the first layer 710 may be a fourth sub-channel signal, and the infrared light signal corresponding to the infrared light that has passed through the transparent pixel T' and has been sensed by the second layer 720 may be a fifth sub-channel signal.

In the case where the respective channel signals are image-processed and are combined together to restore an image, the sensitivity and resolution of the restored image may be increased and the image noise may be reduced using the fourth sub-channel signal and/or the fifth sub-channel signal.

The term "pixel," as used herein, refers to a photo-element unit cell containing at least a photosensor for converting photons to electrical changes. The detector or photosensor of each pixel may be implemented, as nonlimiting examples only, as a pinned photodiode, a p-n junction photodiode, a Schottky photodiode, a photogate, or any other suitable photoconversion device or device that may accumulate and/or store photo charges.

The processes, functions, methods and/or software described above may be recorded, stored, or fixed in one or more computer-readable storage media that includes program instructions to be implemented by a computer to cause a processor to execute or perform the program instructions. The media may also include, alone or in combination with the program instructions, data files, data structures, and the like. The media and program instructions may be those specially designed and constructed, or they may be of the kind well-known and available to those having skill in the computer software arts. Examples of computer-readable media include magnetic media, such as hard disks, floppy disks, and magnetic tape; optical media such as CD-ROM disks and DVDs; magneto-optical media, such as optical disks; and hardware devices that are specially configured to store and perform program instructions, such as read-only memory (ROM), random access memory (RAM), flash memory, and the like. Examples of program instructions include machine code, such as produced by a compiler, and files containing higher level code that may be executed by the computer using an interpreter. The described hardware devices may be configured to act as one or more software modules in order to perform the operations and methods described above, or vice versa. In addition, a computer-readable storage medium may be distributed among computer systems connected through a network and computer-readable codes or program instructions may be stored and executed in a decentralized manner.

As a non-exhaustive illustration only, the device described herein may refer to mobile devices such as a cellular phone, a personal digital assistant (PDA), a digital camera, a portable game console, and an MP3 player, a portable/personal multimedia player (PMP), a handheld e-book, a portable tablet and/or laptop PC, a global positioning system (GPS) navigation, and devices such as a desktop PC, a high definition television (HDTV), an optical disc player, a setup box, and the like consistent with that disclosed herein.

A computing system or a computer may include a microprocessor that is electrically connected with a bus, a user interface, and a memory controller. It may further include a flash memory device. The flash memory device may store N-bit data via the memory controller. The N-bit data is processed or will be processed by the microprocessor and N may be 1 or an integer greater than 1. Where the computing system or computer is a mobile apparatus, a battery may be additionally provided to supply operation voltage of the computing system or computer.

It will be apparent to those of ordinary skill in the art that the computing system or computer may further include an application chipset, a camera image processor (CIS), a mobile Dynamic Random Access Memory (DRAM), and the like. The memory controller and the flash memory device may constitute a solid state drive/disk (SSD) that uses a non-volatile memory to store data.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A color filter array, comprising:
   a pixel layer comprising a plurality of pixels; and
   a dichroic filter being formed either above or below the pixel layer,
   wherein the dichroic filter comprises a plurality of regions comprising a plurality of thicknesses that correspond to the plurality of pixels;
   wherein each of the regions of the dichroic filter is configured to filter a specific wavelength range of light that is to be incident to each of the pixels or that has passed through each of pixels; and
   wherein the specific wavelength range of light filtered by the each of the regions is according to the thicknesses of each of the regions.

2. The color filter array of claim 1, wherein the plurality of pixels comprise: color pixels configured to allow visible light corresponding to a specific color to pass therethrough, and transparent pixels configured to allow white light and infrared light to pass therethrough.

3. The color filter array of claim 1, wherein each of the color pixels comprises:
   one of a red pixel, a green pixel and a blue pixel; or
   one of a cyan pixel, a magenta pixel and a yellow pixel.

4. The color filter array of claim 2, wherein the dichroic filter is further configured to block one of infrared light incident to the color pixels and infrared light that has passed through the color pixels.

5. The color filter array of claim 2, wherein the dichroic filter is further configured to block one of visible light incident to the transparent pixel and visible light that has passed through the transparent pixel.

6. The color filter array of claim 1, wherein the dichroic filter comprises a layered structure in which a layer of titanium dioxide ($TiO_2$) and a layer of silicon dioxide ($SiO_2$) are repeatedly formed.

7. The color filter array of claim 1, wherein:
   the dichroic filter comprises a plurality of regions comprising a plurality of thicknesses; and
   a filtering of a specific wavelength range of light by the dichroic filter is dependent upon the plurality of thicknesses of the plurality of regions.

8. The color filter array of claim 1, wherein:
   the dichroic filter comprises a plurality of regions comprising a plurality of thicknesses; and
   the plurality of thicknesses are configured to determine a specific wavelength range of light that will pass through the dichroic filter and other wavelengths that will be reflected by the dichroic filter.

9. The color filter array of claim 1, wherein:
   the dichroic filter comprises a plurality of regions comprising a plurality of thicknesses; and
   wavelength ranges of light to be passed through the dichroic filter are determined by adjusting the plurality of thicknesses.

10. The color filter array of claim 1, wherein the dichroic filter is formed substantially parallel to the pixel layer.

11. The color-filter array of claim 1, further comprising an image sensor being formed below the pixel layer or the dichroic filter.

12. The color-filter array of claim 1, wherein the dichroic filter is formed below the pixel layer, and the color pixels are configured to allow infrared light to pass therethrough.

13. A color filter array of claim 1, wherein the pixels of the pixel layer have a same thickness.

14. A color filter array of claim 2, wherein the dichroic filter comprises first regions corresponding to the color pixels and second regions corresponding to the transparent pixels.

15. A color filter array of claim 14, wherein the first regions have different thicknesses from that of the second regions.

16. A color filter array of claim 1, wherein the pixel layer is a filter layer comprising at least one color filter and at least one transparent filter.

* * * * *